(12) United States Patent
Feng et al.

(10) Patent No.: US 9,970,981 B2
(45) Date of Patent: May 15, 2018

(54) METHOD AND DEVICE FOR TEMPERATURE MEASUREMENT OF FINFET DEVICES

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Junhong Feng, Shanghai (CN); Zhenghao Gan, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days. days.

(21) Appl. No.: 15/648,408

(22) Filed: Jul. 12, 2017

(65) Prior Publication Data
US 2018/0038742 A1 Feb. 8, 2018

(30) Foreign Application Priority Data
Aug. 2, 2016 (CN) .......................... 2016 1 0620959

(51) Int. Cl.
*G01R 31/26* (2014.01)
*G01K 7/34* (2006.01)
(Continued)

(52) U.S. Cl.
CPC ........... *G01R 31/2628* (2013.01); *G01K 7/01* (2013.01); *G01K 7/346* (2013.01); *G01R 31/26* (2013.01);
(Continued)

(58) Field of Classification Search
None
See application file for complete search history.

(56) References Cited

U.S. PATENT DOCUMENTS

| 7,176,508 B2 * | 2/2007 | Joshi ....................... H01L 22/34 257/253 |
| 2015/0035568 A1 * | 2/2015 | Peng ..................... H01L 27/088 327/109 |

* cited by examiner

*Primary Examiner* — Angel Roman
*Assistant Examiner* — Kevin Quinto
(74) *Attorney, Agent, or Firm* — Kilpatrick Townsend & Stockton LLP

(57) ABSTRACT

A semiconductor structure includes a semiconductor device that includes an active region having a semiconductor fin and a gate structure across the semiconductor fin. The gate structure includes a gate electrode. The semiconductor structure also includes a gate line extending from the gate electrode and a metal wiring that is positioned above the gate line and is electrically connected to the gate line through two or more nodes. The semiconductor structure also includes a first measuring electrode and a second measuring electrode coupled respectively to two ends of the metal wiring, the first measuring electrode disposed closer to the gate electrode than the second measuring electrode. The semiconductor structure is configured to measure the temperature of the semiconductor device. During temperature measurement, the first measurement electrode is coupled to a first potential and the second measurement electrode is coupled to a second potential that is lower than the first potential.

19 Claims, 4 Drawing Sheets

(51) Int. Cl.
*H01L 21/67* (2006.01)
*H01L 29/423* (2006.01)
*G01K 7/01* (2006.01)
*H01L 21/48* (2006.01)
*H01L 21/8238* (2006.01)

(52) U.S. Cl.
CPC ...... *G01R 31/2621* (2013.01); *H01L 21/4853* (2013.01); *H01L 21/67* (2013.01); *H01L 21/823821* (2013.01); *H01L 29/42356* (2013.01)

METHOD AND DEVICE FOR TEMPERATURE MEASUREMENT OF FINFET DEVICES

CROSS-REFERENCES TO RELATED APPLICATIONS

This application claims priority to Chinese patent application No. 201610620959.1, filed on Aug. 2, 2016, the content of which is incorporated herein by reference in its entirety.

BACKGROUND OF THE INVENTION

Embodiments of the present invention relates to testing of semiconductor devices, and more particularly, relates to a semiconductor structure and a method for measuring the temperature of a semiconductor device.

As semiconductor devices continue to reduce the size, self-heating effect in the fin-type devices (for example, FinFET device) on device performance has become a challenge. Due to self-heating effect, it is becoming more difficult to evaluate the performance of semiconductor devices under operating conditions. Therefore, there is a need for new semiconductor structures and methods of measurement to determine the heating effect of semiconductor devices.

FIG. 1 is a top view diagram illustrating a conventional semiconductor structure for temperature measurement. FIG. 1 shows a fin-type device including a fin 100, a gate electrode 102, and electrodes for a source region and a drain region are labeled as 104 and 106, respectively. Electrical interconnection regions 108 are disposed at both ends of the gate electrode 102 has an electrical. Gate electrode 102 and electrical interconnect regions 108 are used as a temperature sensor. By measuring the resistance of the gate electrode 102, its temperature can be determined based on the relationship between the resistivity of the gate material and temperature. Since the gate electrode 102 is coupled to the interconnect 108 at both ends, the device cannot be used to measure the resistance of the gate 102 when the device is working. In actual measurement, the semiconductor device needs to be started until after it is raised to near the operating temperature. At this time, the semiconductor device is turned off, and then different potentials are applied to the electrical interconnect regions 108 to measure the resistance of the gate electrode 102. The disadvantage of this method is that, since the semiconductor device has been stopped at the time of the temperature measurement, the heat generated by the device has been partially dissipated, so that the measurement would be made at a temperature lower than the actual device operating temperature. Accordingly, it would be difficult to carry out in-situ measurement while the semiconductor device is operating.

Therefore, there is a need for improved semiconductor structures and methods of measurement to determine the heating effect of semiconductor devices.

BRIEF SUMMARY OF THE INVENTION

According to some embodiments of the present invention, a semiconductor structure includes a semiconductor device that includes an active region having a semiconductor fin and a gate structure across the semiconductor fin. The gate structure includes a gate electrode. The semiconductor structure also includes a gate line extending from the gate electrode. The semiconductor structure also includes a metal wiring that is positioned above the gate line and is electrically connected to the gate line through two or more nodes. The semiconductor structure also includes a first measuring electrode and a second measuring electrode coupled, respectively, to two ends of the metal wiring, the first measuring electrode being disposed closer to the gate electrode than the second measuring electrode. The semiconductor structure is configured to measure a temperature of the semiconductor device. During temperature measurement, the first measurement electrode is coupled to a first potential and the second measurement electrode is coupled to a second potential that is lower than the first potential.

In an embodiment of the above semiconductor structure, the gate line is connected to the gate electrode and the metal wiring.

In another embodiment, the metal wiring is a serpentine metal wiring extending along a length thereof and includes a longitudinal portion extending in a direction of the gate line and a lateral portion extending in a direction intersecting the gate line.

In another embodiment, a length of the longitudinal portion of the serpentine metal wiring is greater than a length of the lateral portion so that the longitudinal portion has a resistance greater than that of the lateral portion. The semiconductor structure may also include the first measuring electrode located at a first end of the serpentine metal wiring close to the gate electrode, and the second measuring electrode is located at a second end of the serpentine metal wiring away from the gate electrode.

In an embodiment, a length ratio between the longitudinal portion and the lateral portion of the metal wiring is from 10 to 100. In an embodiment, a length of the serpentine metal wiring is between 0.1 to 50 microns.

In another embodiment, the metal wiring includes a wiring network. The wiring network includes two or more nodes, and the nodes are electrically connected to the gate line. In an embodiment, the semiconductor structure can include one or more gate lines. The semiconductor structure where a total resistance of the metal wiring is in a range of 10 to 10,000 ohms in a temperature range of 25 to 300 degrees Celsius, the metal wiring can include tungsten or copper, or combinations of these or other metals. In some embodiments, the gate line and the gate electrode are formed from the same layer of conductive material.

According to some embodiments, a method for measuring a temperature of a semiconductor device includes providing a semiconductor device including an active region and a gate structure across a portion of the active region. The gate structure includes a gate electrode. The method also includes providing a measuring structure that includes a gate line extending from the gate electrode, a metal wiring that is positioned above the gate line and is electrically connected to the gate line through two or more nodes. The measuring structure also includes a first measuring electrode and a second measuring electrode coupled, respectively, to two ends of the metal wiring, the first measuring electrode being disposed closer to the gate than the second measuring electrode. The method also includes applying working potentials to a source region and a drain region of the semiconductor device to operate the semiconductor device. The method also includes setting a first measurement electrode and a second measurement electrode of the metal wiring to a first potential and a second potential, respectively. The method further includes measuring a metal wiring resistance value. The method also includes, according to a relationship between the metal wiring resistance value and temperature, determining the temperature of the semiconductor device.

In an embodiment of the above method, the first potential is at a working voltage of the gate, and the second potential is a ground potential.

In some embodiments, the relationship between metal wiring resistance value and temperature is described in a look-up table, which lists a plurality of temperatures and corresponding metal wiring resistances. In an embodiment, determining the relationship between the metal wiring resistance value and temperature is carried out by setting the semiconductor device at different calibration temperatures, applying a third potential and a fourth potential, respectively, to the first measuring electrode and the second measuring electrode of the metal wiring, and measuring metal wiring resistance values at different temperatures. The method may also include determining the relationship between metal wiring resistance value and temperature. In some embodiments, the calibration temperatures are in a range of 25 degrees to 300 degrees Celsius. In some embodiments, a difference between the third potential and the fourth potential is in a range from 1 volt to 10 volts. In some embodiments, a difference between the first potential and the second potential is in a range from 1 volt to 10 volts. In some embodiments, measuring the metal wiring resistance value includes using a metal voltammetry or four wire Kelvin resistance measurement.

Other features and advantages of the present invention will become apparent from the following detailed description of exemplary embodiments of the invention with reference to the accompanying drawings.

BRIEF DESCRIPTION OF THE DRAWINGS

The embodiments of the present invention will be more clearly understood from the following detailed description with reference to the accompanying drawings.

DETAILED DESCRIPTION OF THE INVENTION

Figure 1:
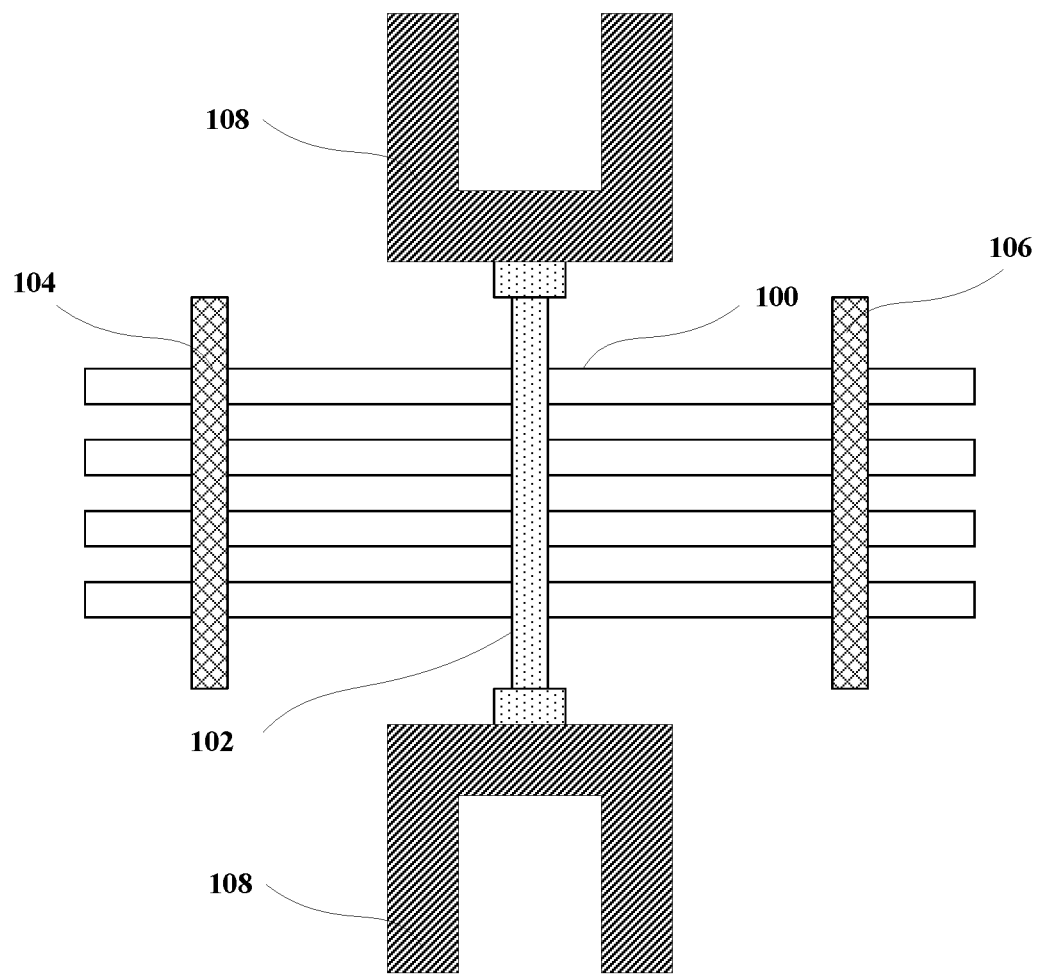
FIG. 1 is a top view diagram illustrating a conventional semiconductor structure for temperature measurement.

Various exemplary embodiments of the present invention will now be described in detail with reference to the accompanying drawings. It should be noted that the relative arrangement, numerical expression and numerical values of the components and steps set forth in these embodiments, unless otherwise specified, do not limit the scope of the invention. At the same time, it will be appreciated that the dimensions of the various portions shown in the drawings are not drawn to scale in actuality for ease of description.

The following description of at least one exemplary embodiment is merely illustrative and is in no way intended as a limitation on the invention, its application or use. The techniques, methods, and apparatus known to those of ordinary skill in the relevant art may not be discussed in detail, but the techniques, methods, and apparatuses, as appropriate, should be considered as part of the specification. In all examples shown and discussed herein, any specific value should be construed as merely exemplary and not as limiting. Thus, other examples of exemplary embodiments may have different values. It should be noted that like reference numerals and letters designate like items in the following drawings, and therefore, once an item is defined in a drawing, it is not necessary to further discuss it in the subsequent figures.

Figure 2:
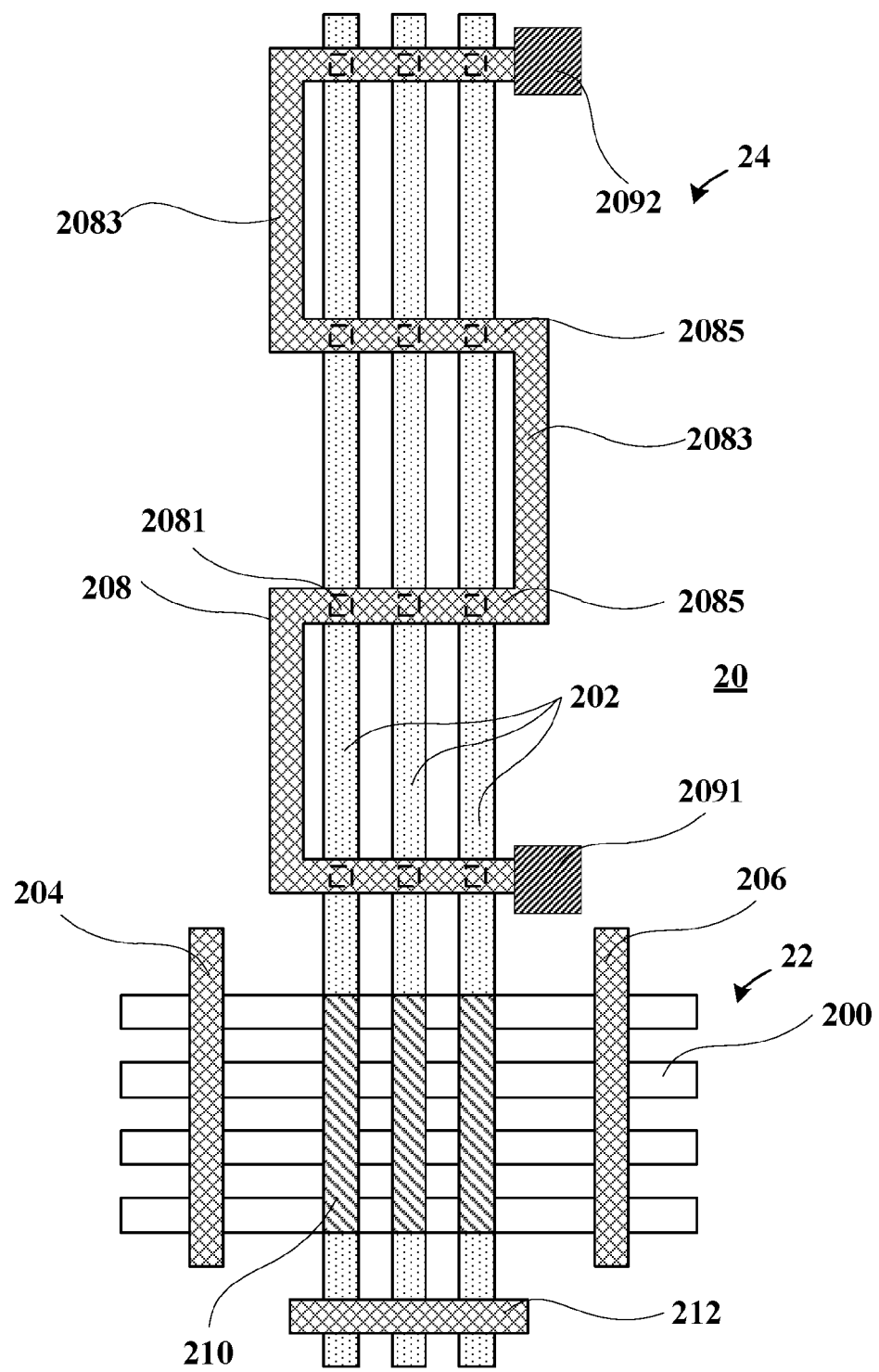
FIG. 2 is a top view diagram illustrating a semiconductor structure according to some embodiments of the present invention.

FIG. 2 is a top view diagram illustrating a semiconductor structure according to some embodiments of the present invention. As shown in FIG. 2, a semiconductor structure 20 may include a semiconductor device 22. Semiconductor device 22 includes an active region, which can be formed in a semiconductor fin 200, and a gate structure across the semiconductor fin. The gate structure can includes a gate electrode 210. Those skilled in the art will readily appreciate that the gate structure may also include a gate insulating layer formed on the active region on semiconductor fin 200 (in this case, gate electrode 210 is disposed on the gate insulating layer). The gate structure can also include spacer regions adjacent the gate electrode. To simplify the drawings, these components are not shown in FIG. 1. It is further understood that the semiconductor device can include one or more semiconductor fins.

As those skilled in the art will readily appreciate, the active region may include a source region and a drain region, and a channel region formed between the source region and the drain region. It is also understood that, although the terms used herein include a source region, a drain region, a gate electrode, a gate insulating layer, and the like, the device is not necessarily limited to MOS devices. For example, the device may also be involved in other devices, e.g., gated diode (GateD diode) or LDMOS, and the like. Thus, the source region, drain region, gate electrode, and gate insulating layer should be understood as a first current carrying electrode, a second current carrying electrodes, an electrode separated from the active region with a dielectric, and the dielectric region separating the operating electrodes and the active region.

In FIG. 2, semiconductor structure 20 further includes a measurement structure 24, which can include one or more gate lines 202 extending from the gate electrode 210 beyond the active region of the semiconductor device 22. The gate line 202 and the gate electrode 210 can be formed from the same layer of conductive material. Conductive material for the gate line 202 or gate electrode 210 may include copper, tungsten, aluminum, and other metal materials, or combination of different metal materials. It may also include a gate interconnect 212.

Semiconductor structure 20 further includes a metal wiring 208 formed above gate lines 202. Metal wiring 208 may be connected via two or more nodes 2081 with the gate line 202 electrically. In FIG. 2, the nodes are shown in dashed boxes. Here it will be understood that the metal wiring layer 208 and the gate line 202 may be separated by a dielectric layer, although in FIG. 2, for clarity of illustration, are not shown. In one embodiment, the gate line 202 may be electrically connected to the gate electrode 210, and the gate line 202 may be connected to the metal wire 208 through the nodes 2081.

Metal wiring 208 is coupled, at a first end, with a first measuring electrode 2091 and, at a second end, the second measuring electrode 2092. As shown in FIG. 2, the first measuring electrode 2091 is set to be closer to gate 210 than the second measuring electrode 2092. The first measuring electrode 2091 and the second measuring electrode 2092 may be located on the same side of the metal wiring 208, as shown in FIG. 2, or they may be located on either side thereof.

According to an embodiment of the present invention, the temperature measurement can be carried out at the time when the semiconductor device 22 is working properly. When making such measurements, preferably, the first measuring electrode 2091 is coupled to a first potential, and the second measuring electrode 2092 is coupled to a second potential lower than the first potential. For example, the first potential may be the same as the operating voltage of the gate, and the second potential may be a ground potential.

Figure 3:
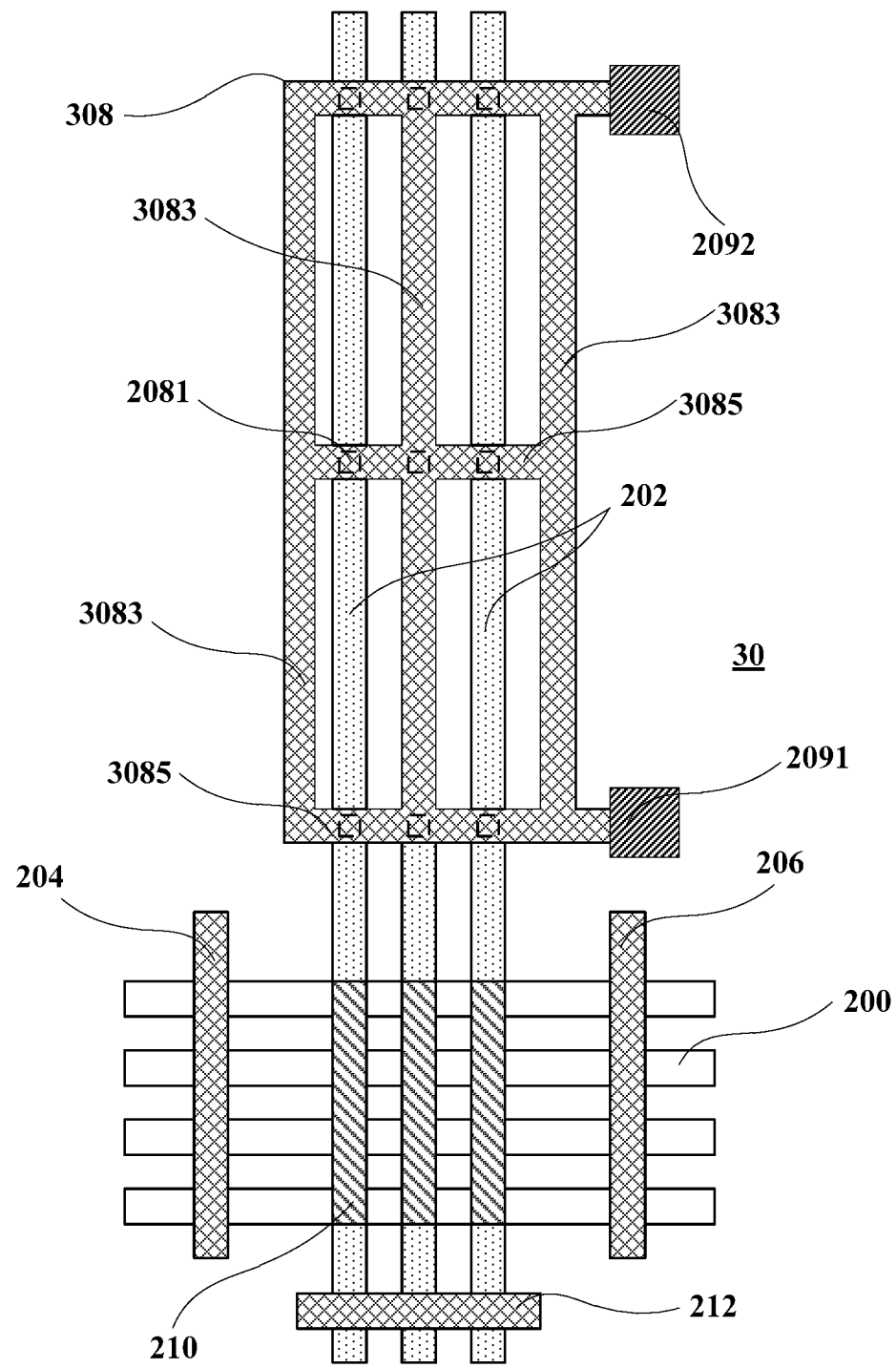
FIG. 3 is a top view diagram illustrating an alternative semiconductor structure according to some embodiments of the present invention.

Although in the examples shown in FIGS. 2 and 3, three gate lines 202 are illustrated, it is understood that this is merely exemplary. In some implementations, the number of gate lines 202 may be one or more. In other words, the metal wiring 208 may be disposed on top of a single gate line 202, or multiple gate lines 202.

In one implementation, metal wiring 208 may be a serpentine metal wiring as shown in FIG. 2. The serpentine metal wiring can extend along its length (for example, in a zigzag manner or, in a serpentine meandering stretch). As shown in FIG. 2, serpentine metal wiring 208 may include one or more longitudinal portions 2083 extending along the direction of gate line 202. Serpentine metal wiring 208 may also include one or more transverse portions 2085 extending along the direction intersecting the gate line 202. Thus, for example, the transverse portion may extend across over the gate line 202.

Preferably, the longitudinal portion of the serpentine metal wiring 2083 is longer than the length of the transverse portion 2085. In some embodiments, preferably, a length ratio between the longitudinal portion and the lateral portion of the metal wiring is from 10 to 100. In these embodiments, the resistance of the longitudinal portion is much greater than the resistance of the transverse portion. In these embodiments, the resistance of the transverse portions can be ignored when the resistance of the metal wiring is used for temperature measurement.

The material for the metal wiring may be copper or tungsten, or other metal or conductive materials that have good correlation between resistivity and material temperature. In some embodiments, the serpentine metal wiring may have a length of about 0.1 to 50 microns, a width of about 0.01 to 5 microns, and a thickness of about 50-200 nanometers.

In another embodiment, the geometry and material of the serpentine metal wiring may be configured such that the resistance value is between 10-10000 ohmic value in a temperature range of 25-300 degrees Celsius.

Preferably, the first measuring electrode 2091 at one end of the serpentine metal wiring is located near gate electrode 210, and the second measuring electrode 2092 at the other end of the serpentine metal wiring is located farther away gate electrode 210.

FIG. 3 is a top view diagram illustrating an alternative semiconductor structure according to some embodiments of the present invention. A semiconductor structure 30 in FIG. 3 includes several of the same components as semiconductor structure 20 in FIG. 2, and these components are not described in detail here. As shown in FIG. 3, the metal wiring can be in the form of a metal wiring network 308, the network wiring extending along its length. Wiring network 308 can include one or more longitudinal portion 3083 extending in the direction of the gate line 202. Wiring network 308 can also include one or more transverse portions 3085 extending in a direction across the gate line 202.

Preferably, the longitudinal portion of the serpentine metal wiring 3083 is longer than the length of the transverse portion 3085. In some embodiments, preferably, a length ratio between the longitudinal portion and the lateral portion of the metal wiring is from 10 to 100. In these embodiments, the resistance of the longitudinal portion is much greater than the resistance of the transverse portion. In these embodiments, the resistance of the transverse portions can be ignored when the resistance of the metal wiring is used for temperature measurement.

The material for the metal wiring may be copper or tungsten, or other metal or conductive materials that have good correlation between resistivity and material temperature. In some embodiments, the serpentine metal wiring may have a length of about 0.1 to 50 microns, a width of about 0.01 to 5 microns, and a thickness of about 50-200 nanometers.

In another embodiment, the geometry and material of the serpentine metal wiring may be configured such that the resistance value is between 10-10000 ohms in a temperature range of 25-300 degrees Celsius.

Preferably, the first measuring electrode 2091 at one end of the serpentine metal wiring is located near gate electrode 210, and the second measuring electrode 2092 at the other end of the serpentine metal wiring is located farther away gate electrode 210.

It is understood that methods known in the art, including process steps, materials, etc., can be used to form the semiconductor structure of the embodiments described above. Therefore, the details of the process of forming a semiconductor structure is not described in detail.

Figure 4:
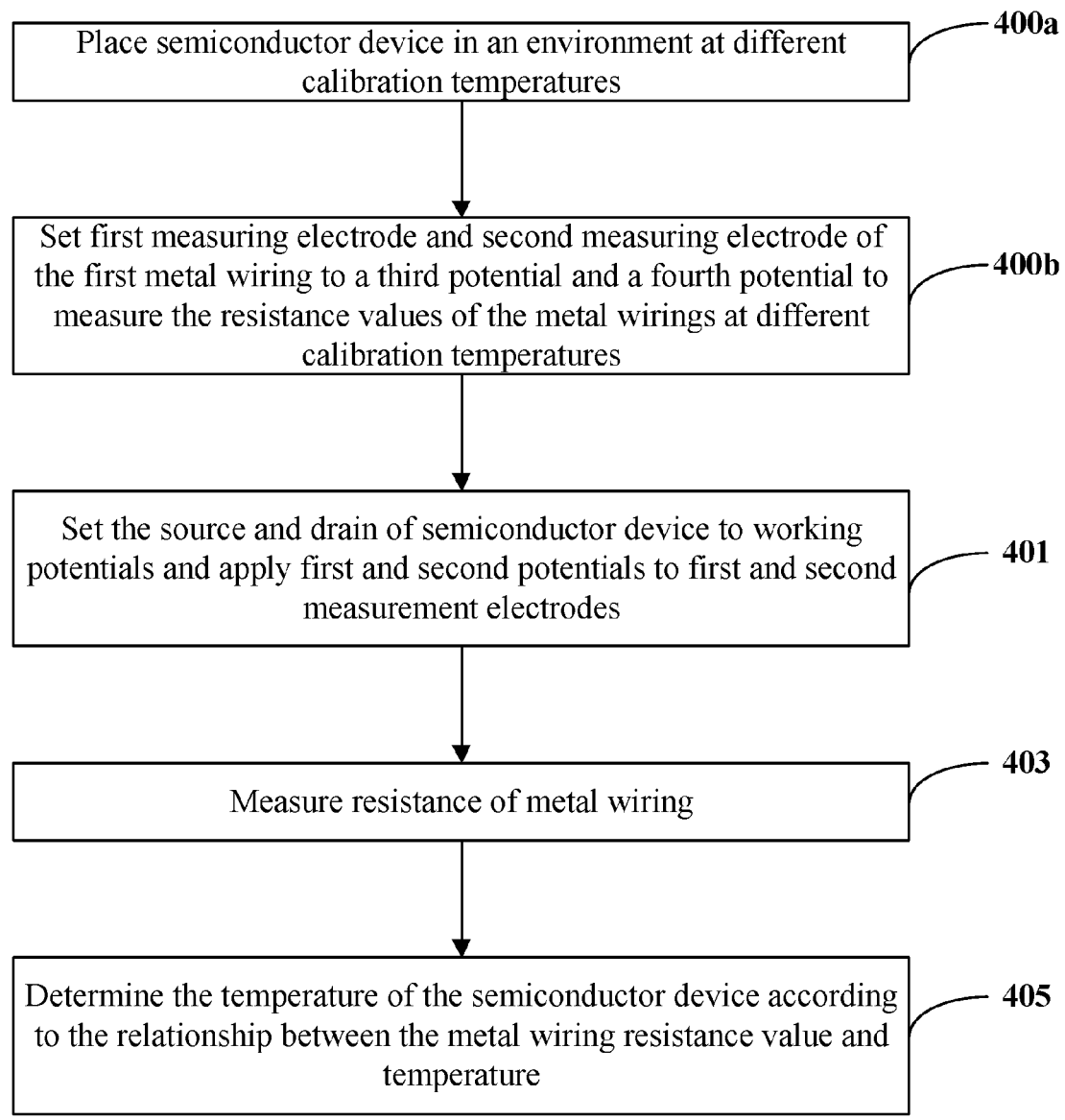
FIG. 4 is a flowchart illustrating a method for measuring the temperature of a semiconductor device according to an embodiment of the present invention.

FIG. 4 is a flowchart illustrating a method for measuring the temperature of a semiconductor device according to an embodiment of the present invention. The method is described below with reference to the semiconductor structure in FIGS. 2 and 4.

At Step 401, the method includes applying working potentials to a source region and a drain region of the semiconductor device to operate the semiconductor device. For example, the source/drain electrode regions 204 and 206 and the gate electrode 212 are electrically interconnected to the respective working voltages, so that the semiconductor device 22 is active. Merely as an example, the gate electrode and the drain electrode can be set at a voltage or potential of 3 volts, and the source electrode can be set at a ground voltage or potential. The first measuring electrode 2091 and the second measurement electrode 2092 of the serpentine metal wiring 208 are set to a first potential and a second potential. For example, the first potential and the gate electrode 210 (i.e., the gate electrical interconnection 212) can be set at the working voltage, and the second potential is set to ground potential. In this arrangement, the first measuring potential and the second measuring potential do not affect the normal operation of the semiconductor device.

Preferably, the difference between the first potential and the second potential difference can have an absolute value in the range of 1 volt to 10 volts. It will be understood by those skilled in the art that the appropriate first potential and second potential values can be selected according to the actual situation of the semiconductor device to be measured and the properties of the metal wiring.

At Step 403, the method includes setting a first measurement electrode and a second measurement electrode of the metal wiring to a first potential and a second potential, respectively, and measuring a metal wiring resistance value;

At Step 405, according to a relationship between the metal wiring resistance value and temperature, determining the temperature of the semiconductor device.

In one implementation, the relationship between the resistance value of serpentine metal wiring 208 and temperature may be provided in a lookup table form. The lookup table can include a series of temperature values corresponding to the resistance of the serpentine metal wiring. In step 405, after determining the resistance of the metal wiring, the corresponding temperature can be obtained from the lookup table.

In alternative embodiments, prior to Step 401, the method can also include obtaining the relationship between the metal wiring resistance and temperature in different calibration temperature environments. As shown in Step 400a, the semiconductor device is placed in an environment at different calibration temperatures. In one embodiment, for example, the range of the calibration temperature can vary from 25 degrees to 300 degrees Celsius, in order to cover the temperature range of the device that can be caused by heating generated by the device working temperature range. It will be appreciated that a smaller or larger range of calibrated temperature may be selected depending on the actual operation of the device.

At Step 400b, the first measuring electrode and the second measuring electrode of the first metal wiring are respectively set to a third potential and a fourth potential to measure the resistance values of the metal wirings at different calibration temperatures, thereby obtaining the corresponding relationship between the metal wiring resistance value and temperature. In some embodiments, the absolute value of the voltage difference between the third potential and the fourth potential can be in the range of 1 volt to 10 volts.

In some embodiments, for example, the semiconductor structure 20 is placed in the calibration temperature environment, with the source/drain regions and the gate electrode open. The first measurement electrode 2091 and the second measurement electrode 2092 of metal wiring 208, respectively, are held at the third potential and the fourth potential. The relationship between resistance and temperature can be determined in the calibration temperature of the environment using voltammetry or the Kelvin four-wire detection method. When the measured resistance is small, resistance testing may be carried out using the Kelvin four-wire detection method. By changing the temperature and measuring the resistance value of the metal wiring 208 at different calibration temperatures, the relationship with the temperature and resistance can be determined. During in-situ measurement with the semiconductor device in operating conditions, the device temperature can be obtained from the measured resistance.

Thus, embodiments of the semiconductor structure and the temperature measuring method have been described in detail. To avoid obscuring the teachings of the present disclosure, details of the known art are not described in some detail. Those skilled in the art can understand how to implement technical solutions from the above description disclosed herein. Further, various embodiments as taught can be freely combined. Those skilled in the art will appreciate that the embodiments described above can have various modifications without departing from the scope of the spirit of the disclosure.

What is claimed is:

1. A semiconductor structure, comprising:
 a semiconductor device including an active region having a semiconductor fin and a gate structure across the semiconductor fin, the gate structure including a gate electrode;
 a gate line extending from the gate electrode;
 a metal wiring that is positioned above the gate line and is electrically connected to the gate line through two or more nodes;
 a first measuring electrode and a second measuring electrode coupled respectively to two ends of the metal wiring, the first measuring electrode being disposed closer to the gate electrode than the second measuring electrode;
 wherein said semiconductor structure is configured to measure a temperature at the semiconductor device; and
 wherein, during temperature measurement, the first measurement electrode is coupled to a first potential and the second measurement electrode is coupled to a second potential that is lower than the first potential.

2. The semiconductor structure of claim 1, wherein the gate line is connected to the gate electrode and the metal wiring.

3. The semiconductor structure of claim 1, wherein the metal wiring is a serpentine metal wiring extending along a length thereof and includes a longitudinal portion extending in a direction of the gate line and a lateral portion extending in a direction intersecting the gate line.

4. The semiconductor structure of claim 3, wherein:
 a length of the longitudinal portion of the serpentine metal wiring is greater than a length of the lateral portion so that the longitudinal portion has a resistance greater than that of the lateral portion, and
 the first measuring electrode is located at a first end of the serpentine metal wiring close to the gate electrode, and the second measuring electrode is located at a second end of the serpentine metal wiring away from the gate electrode.

5. The semiconductor structure of claim 3, wherein a length ratio between the longitudinal portion and the lateral portion of the metal wiring is from 10 to 100.

6. The semiconductor structure of claim 3, wherein a length of the serpentine metal wiring is between 0.1 to 50 microns.

7. The semiconductor structure of claim 1, wherein the metal wiring comprises a wiring network, the wiring network includes two or more nodes, the nodes electrically connected to the gate line.

8. The semiconductor structure of claim 1, wherein the semiconductor structure includes one or more gate lines.

9. The semiconductor structure of claim 1, wherein a total resistance of the metal wiring is in a range of 10 to 10,000 ohms in a temperature range of 25 to 300 degrees Celsius.

10. The semiconductor structure of claim 1, wherein the metal wiring comprises tungsten or copper.

11. The semiconductor structure of claim 1, wherein said gate line and said gate electrode are formed from the same layer of conductive material.

12. A method for measuring a temperature of a semiconductor device, the method comprising:
 providing a semiconductor device including an active region and a gate structure across a portion of the active region, the gate structure including a gate electrode;

providing a measuring structure that includes:
   a gate line extending from the gate electrode;
   a metal wiring that is positioned above the gate line and is electrically connected to the gate line through two or more nodes; and
   a first measuring electrode and a second measuring electrode coupled respectively to two ends of the metal wiring, the first measuring electrode being disposed closer to the gate electrode than the second measuring electrode;
applying working potentials to a source region and a drain region of the semiconductor device to operate the semiconductor device;
setting a first measurement electrode and a second measurement electrode of the metal wiring to a first potential and a second potential, respectively;
measuring a metal wiring resistance value; and
determining the temperature of the semiconductor device according to the relationship between the metal wiring resistance value and temperature.

13. The method of claim 12, wherein the first potential is at a working voltage of the gate, and the second potential is a ground potential.

14. The method of claim 12, wherein the relationship between metal wiring resistance value and temperature is described in a look-up table which lists a plurality of temperatures and corresponding metal wiring resistances.

15. The method of claim 12, further comprising determining the relationship between the metal wiring resistance value and temperature by:
   setting the semiconductor device at different calibration temperatures;
   applying a third potential and a fourth potential, respectively, to the first measuring electrode and the second measuring electrode of the metal wiring;
   measuring metal wiring resistance values at different temperatures; and
   determining the relationship between metal wiring resistance value and temperature.

16. The method of claim 15, wherein the calibration temperatures are in a range of 25 degrees to 300 degrees Celsius.

17. The method of claim 15, wherein a difference between the third potential and the fourth potential is in a range from 1 volt to 10 volts.

18. The method of claim 12, wherein a difference between the first potential and the second potential is in a range from 1 volt to 10 volts.

19. The method of claim 12, wherein measuring the metal wiring resistance value comprises using a metal voltammetry or four wire Kelvin method.

* * * * *